United States Patent
Shimizu et al.

(10) Patent No.: US 9,153,646 B2
(45) Date of Patent: Oct. 6, 2015

(54) SEMICONDUCTOR DEVICE AND METHOD FOR MANUFACTURING THE SAME

(71) Applicant: Kabushiki Kaisha Toshiba, Tokyo (JP)

(72) Inventors: Tatsuo Shimizu, Tokyo (JP); Takashi Shinohe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 13/795,339

(22) Filed: Mar. 12, 2013

(65) Prior Publication Data

US 2014/0084303 A1 Mar. 27, 2014

(30) Foreign Application Priority Data

Sep. 26, 2012 (JP) ................. 2012-213161

(51) Int. Cl.

| H01L 29/78 | (2006.01) |
|---|---|
| H01L 29/16 | (2006.01) |
| H01L 29/66 | (2006.01) |
| H01L 29/10 | (2006.01) |

(Continued)

(52) U.S. Cl.
CPC .......... *H01L 29/1608* (2013.01); *H01L 21/049* (2013.01); *H01L 29/105* (2013.01); *H01L 29/1095* (2013.01); *H01L 29/167* (2013.01); *H01L 29/66068* (2013.01); *H01L 29/7395* (2013.01); *H01L 29/7802* (2013.01); *H01L 29/7805* (2013.01); *H01L 29/0878* (2013.01); *H01L 29/32* (2013.01); *H01L 29/34* (2013.01); *H01L 29/6606* (2013.01); *H01L 29/7391* (2013.01); *H01L 29/94* (2013.01)

(58) Field of Classification Search
CPC ............................ H01L 29/78; H01L 29/7841
See application file for complete search history.

(56) References Cited

U.S. PATENT DOCUMENTS

| 2012/0199846 A1 | 8/2012 | Shimizu et al. |
| 2012/0223330 A1 | 9/2012 | Dhar et al. |

(Continued)

FOREIGN PATENT DOCUMENTS

| JP | 2012-164788 | 8/2012 |
| JP | 2013-254789 | 12/2013 |

OTHER PUBLICATIONS

Japanese Office Action issued Jul. 24, 2014, in Japan Patent Application No. 2012-213161 (with English translation).

(Continued)

*Primary Examiner* — Jae Lee
(74) *Attorney, Agent, or Firm* — Oblon, McClelland, Maier & Neustadt, L.L.P.

(57) ABSTRACT

According to one embodiment, a semiconductor device includes a structural body, an insulating film, and a control electrode. The structural body has a first surface, and includes a first semiconductor region including silicon carbide of a first conductivity type, a second semiconductor region including silicon carbide of a second conductivity type, and a third semiconductor region including silicon carbide of the first conductivity type. The structural body has a portion in which the first semiconductor region, the second semiconductor region, and the third semiconductor region are arranged in this order in a first direction along the first surface. The insulating film is provided on the first surface of the structural body. The control electrode is provided on the insulating film. The structural body has a buried region provided between the second semiconductor region and the first surface. The buried region is doped with a group V element.

19 Claims, 9 Drawing Sheets

(51) Int. Cl.
  *H01L 29/167*  (2006.01)
  *H01L 21/04*   (2006.01)
  *H01L 29/32*    (2006.01)
  *H01L 29/34*    (2006.01)
  *H01L 29/739*   (2006.01)
  *H01L 29/94*    (2006.01)
  *H01L 29/08*    (2006.01)

(56) References Cited

U.S. PATENT DOCUMENTS

2012/0228630 A1* 9/2012 Shimizu et al. .......... 257/77

2012/0321854 A1* 12/2012 Therrien et al. .......... 428/156

OTHER PUBLICATIONS

D. Okamoto et al. "Systematic Investigation of Interface Properties in 4H-SiC MOS Structures Prepared by Over-Oxidation of Ion-Implanted Substrates", Materials Science Forum vols. 645-648 (2010), pp. 495-498.

Koutarou Kawahara, et al., "Detection and depth analyses of deep levels generated by ion implantation in n- and p-type 4H-SiC", Journal of Applied Physics, vol. 106, No. 1, American Institute of Physics, (Jul. 2009), pp. 013719-1 to 013719-6.

* cited by examiner

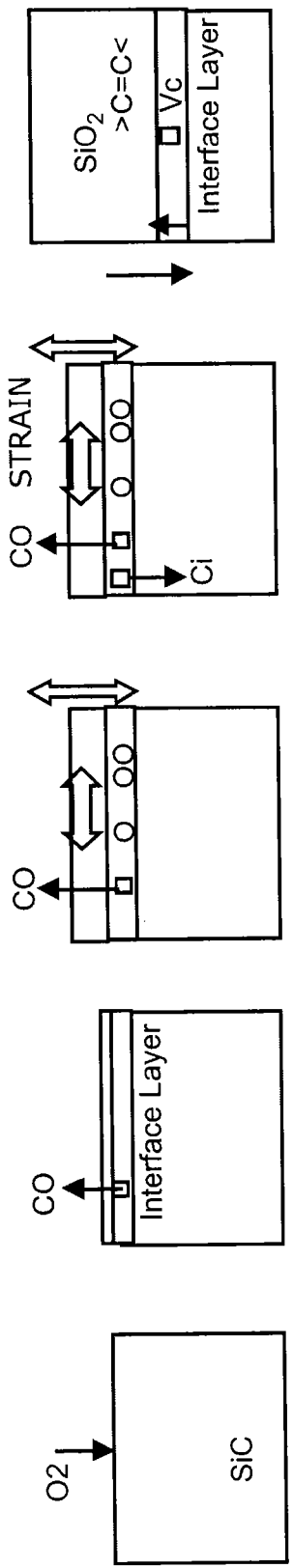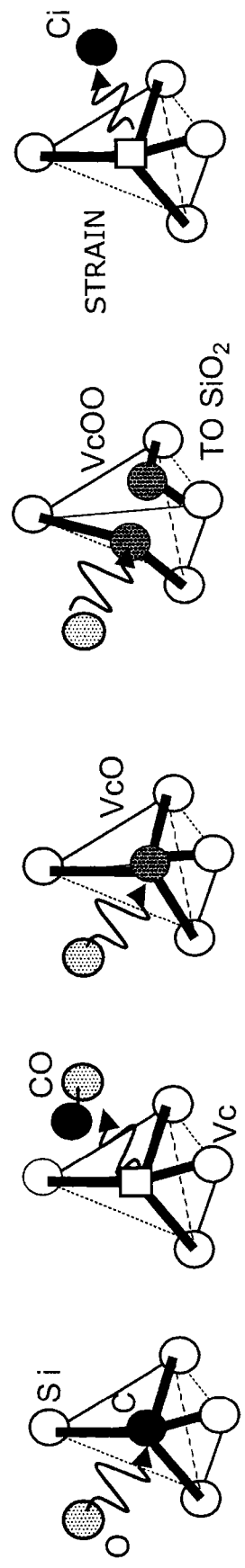

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2012-213161, filed on Sep. 26, 2012; the entire contents of which are incorporated herein by reference.

FIELD

Embodiments described herein relate generally to a semiconductor device and a method for manufacturing the same.

BACKGROUND

As a semiconductor device capable of operating at low loss and high temperature, for instance, a device based on silicon carbide (SiC) has been drawing attention. Compared with silicon (Si), silicon carbide (SiC) has superior material properties, such as three times wider band gap, approximately 10 times larger breakdown electric field strength, and approximately three times higher thermal conductivity.

In a MOSFET (metal oxide semiconductor field effect transistor) based on SiC, hydrogen termination is applied to the surface of a SiC substrate. Then, an insulating film made of $SiO_2$ is formed on the SiC substrate by surface oxidation or insulating film deposition.

In a MOSFET based on a substrate of SiC of the 4H structure (4H—SiC), the mobility at the interface between the SiC substrate and the insulating film made of $SiO_2$ is very small. Various modifications have been made to the insulating film and the interface only to obtain a low mobility (less than 100 $cm^2$/Vs) far from the intrinsic characteristics of 4H—SiC (1000 $cm^2$/Vs).

To form a channel of the MOSFET, aluminum (Al) as p-type dopant is introduced by ion implantation and the like. In this case, a certain large amount needs to be introduced to obtain a high breakdown voltage. However, an excessively large amount of introduction results in increasing the threshold and incurs the decrease of mobility. In a semiconductor device, it is important to obtain high breakdown voltage and stable threshold.

BRIEF DESCRIPTION OF THE DRAWINGS

FIG. 4A to FIG. 4J are schematic views illustrating the formation mechanism of a C defect near the interface;

DETAILED DESCRIPTION

Figure 1:
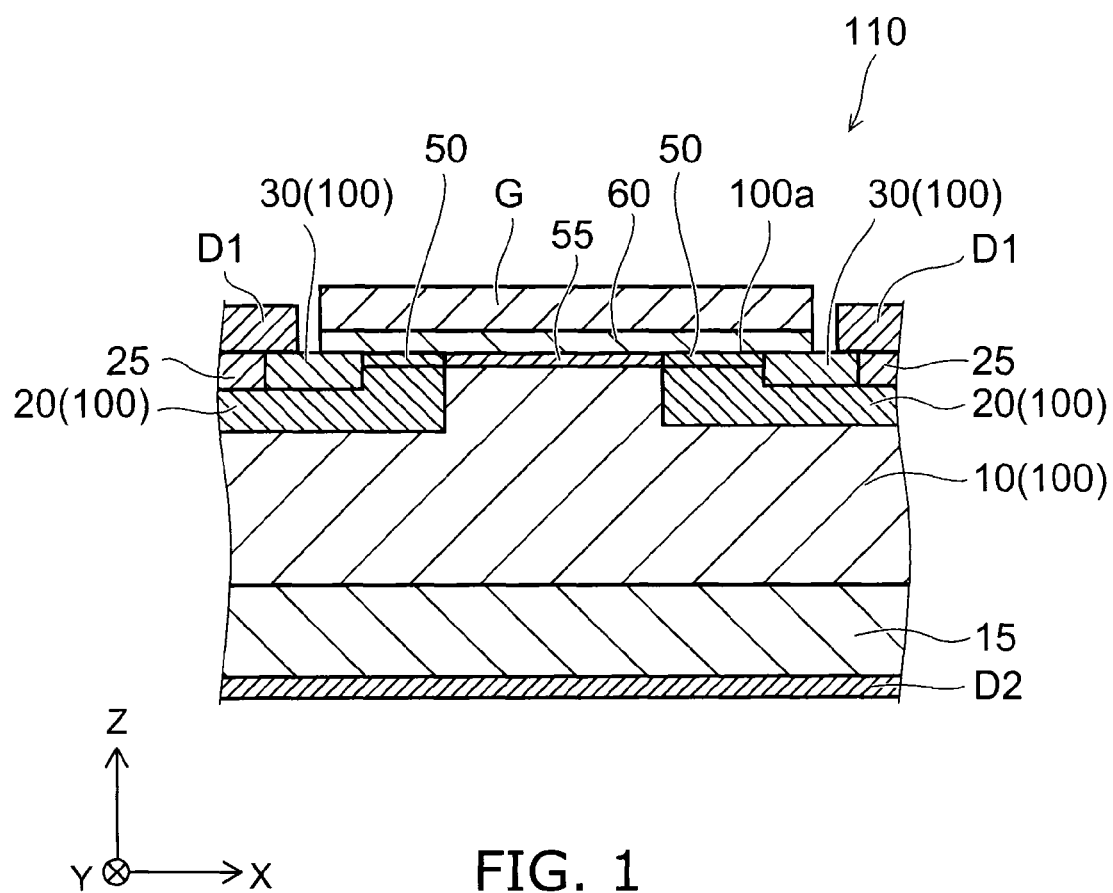
FIG. 1 is a schematic view illustrating the configuration of a semiconductor device according to a first embodiment.

According to one embodiment, a semiconductor device includes a structural body, an insulating film, and a control electrode. The structural body has a first surface. The structural body includes a first semiconductor region including silicon carbide of a first conductivity type, a second semiconductor region including silicon carbide of a second conductivity type, and a third semiconductor region including silicon carbide of the first conductivity type. The structural body has a portion in which the first semiconductor region, the second semiconductor region, and the third semiconductor region are arranged in an order from the first semiconductor region toward the third semiconductor region in a first direction along the first surface. The insulating film is provided on the first surface of the structural body. The control electrode is provided on the insulating film. The structural body has a buried region provided between the second semiconductor region and the first surface. The buried region is doped with a group V element.

Various embodiments will be described hereinafter with reference to the accompanying drawings.

In the following description, like members are labeled with like reference numerals, and the description of the members once described is omitted appropriately.

In the following description, the notations of $n^+$, n, $n^-$ and $p^+$, p, $p^-$ represent relative magnitude of impurity concentration in each conductivity type. That is, $n^+$ represents relatively higher n-type impurity concentration than n, and $n^-$ represents relatively lower n-type impurity concentration than n. Similarly, $p^+$ represents relatively higher p-type impurity concentration than p, and $p^-$ represents relatively lower p-type impurity concentration than p.

In the examples illustrated in the embodiments, by way of example, the first conductivity type is n-type, and the second conductivity type is p-type.

First Embodiment

FIG. 1 is a schematic view illustrating the configuration of a semiconductor device according to a first embodiment.

As shown in FIG. 1, the semiconductor device 110 according to the first embodiment is e.g. a DiMOSFET (double implanted metal oxide semiconductor field effect transistor) based on SiC.

The semiconductor device 110 includes a structural body 100, an insulating film 60, and a control electrode G. The structural body 100 has a first surface 100a. The structural body 100 includes a first semiconductor region 10, a second semiconductor region 20, and a third semiconductor region 30.

In the embodiment, one direction (first direction) along the first surface 100a is referred to as X direction. The direction (third direction) along the first surface 100a and orthogonal to the X direction is referred to as Y direction. The direction (second direction) orthogonal to the X direction and the Y direction is referred to as Z direction.

The structural body 100 has a portion in which the first semiconductor region 10, the second semiconductor region 20, and the third semiconductor region 30 are arranged in this order in the X direction. The structural body 100 has a portion in which the first semiconductor region 10, the second semiconductor region 20, and the third semiconductor region 30 are arranged in this order in the Z direction.

The first semiconductor region 10, the second semiconductor region 20, and the third semiconductor region 30 are stacked in this order in the Z direction. A portion of the first semiconductor region 10 is exposed at the first surface 100a. A portion of the second semiconductor region 20 is exposed at the first surface 100a. A portion of the third semiconductor region 30 is exposed at the first surface 100a. On the first surface 100a side of the structural body 100, a portion of the first semiconductor region 10, a portion of the second semiconductor region 20, and a portion of the third semiconductor region 30 are arranged in the X direction. The portion of the second semiconductor region 20 is provided between the portion of the first semiconductor region 10 and the portion of the third semiconductor region 30.

In manufacturing the structural body 100, the second semiconductor region 20 is formed in a portion on the front surface side of the first semiconductor region 10, and the third semiconductor region 30 is formed in a portion on the front surface side of the second semiconductor region 20.

The second semiconductor region 20 may be provided in a plurality. In the case where a plurality of second semiconductor regions 20 are provided, the plurality of second semiconductor regions 20 are spaced from each other in the X direction and the Y direction. The second semiconductor region 20 can be provided in various shapes, such as a line shape extending in the Y direction, an island shape as viewed in the Z direction, and a ring shape as viewed in the Z direction.

The third semiconductor region 30 may be provided in a plurality. In the case where a plurality of third semiconductor regions 30 are provided, the plurality of third semiconductor regions 30 are spaced from each other in the X direction. The third semiconductor region 30 is provided in e.g. a line shape, island shape, ring shape or the like in conformity with the shape of the second semiconductor region 20.

The portion of the second semiconductor region 20 provided between the portion of the first semiconductor region 10 and the portion of the third semiconductor region 30 on the first surface 100a side constitutes a portion functioning as a channel of the DiMOSFET.

The insulating film 60 is provided on the first surface 100a of the structural body 100. The insulating film 60 functions as a gate insulating film of the DiMOSFET. The insulating film 60 is provided along the first surface 100a. The insulating film 60 is provided on the first semiconductor region 10, the second semiconductor region 20, and the third semiconductor region 30.

The control electrode G is provided on the insulating film 60. The control electrode G functions as a gate electrode of the DiMOSFET.

In such a semiconductor device 110, the structural body 100 has a buried region 50. The buried region 50 is provided between the second semiconductor region 20 and the first surface 100a. In the buried region 50, silicon or carbon of silicon carbide included in the structural body 100 is replaced by a group V element.

If such a buried region 50 is provided, the concentration of p-type impurity of the second semiconductor region 20 may be increased. This increases the breakdown voltage of the semiconductor device 110. Furthermore, provision of the buried region 50 suppresses crystal defects in the second semiconductor region 20 and increases the mobility. Moreover, charge trapping in carbon defects and charge trapping in the surface are suppressed. This stabilizes the threshold.

Next, an example of the semiconductor device 110 is described.

The first semiconductor region 10 is provided on a substrate 15 including high concentration n-type ($n^+$-type) silicon carbide (4H—SiC). The first semiconductor region 10 is e.g. a low concentration n-type ($n^-$-type) 4H—SiC layer.

In the embodiment, the structure with the first semiconductor region 10 formed on the substrate 15 is used as a device formation substrate. The impurity concentration of the first semiconductor region 10 ($n^-$-type SiC layer) is lower than the impurity concentration of the substrate 15 ($n^+$-type SiC substrate). The first semiconductor region 10 constitutes a breakdown voltage retention layer of the semiconductor device 110.

SiC can assume many crystal polytypes. In the embodiment, the 4H structure is used as a crystal polytype of SiC. In the semiconductor device 110 based on SiC of the 4H structure, high breakdown voltage is obtained. Furthermore, this is suitable for fabrication of power devices because of high mobility in the bulk.

On the rear surface of the substrate 15, a second electrode D2 including a conductive material is formed. The second electrode D2 constitutes e.g. a drain electrode of the DiMOSFET. The second electrode D2 has e.g. a stacked structure of Ni and Ti formed by evaporation. The second electrode D2 is ohmically connected to the rear surface of the substrate 15 by e.g. annealing at 1000° C.

In a portion on the surface of the first semiconductor region 10, a plurality of second semiconductor regions 20 spaced from each other and having a prescribed film thickness are provided. The second semiconductor region 20 is a low concentration p-type ($p^-$-type) SiC region. The second semiconductor region 20 is formed from the first surface 100a of the structural body 100 to a depth halfway inside. Between two second semiconductor regions 20, the first semiconductor region 10 is placed. The second semiconductor region 20 may be shaped like a ring or honeycomb as viewed in the Z direction.

In a portion on the surface of the second semiconductor region 20, a third semiconductor region 30 having a prescribed film thickness is provided from the first surface 100a of the structural body 100 to a depth halfway inside. The third semiconductor region 30 is a high concentration n-type ($n^-$-type) SiC region.

In a portion on the surface of the second semiconductor region 20, a contact region 25 is provided. The contact region 25 is juxtaposed with the third semiconductor region 30. The contact region 25 is a p-type ($p^+$-type) SiC region.

Thus, the second semiconductor region 20 is provided between the first semiconductor region 10 and the third semiconductor region 30. The second semiconductor region 20 is in contact with each of the first semiconductor region 10 and the third semiconductor region 30. A channel is formed in the second semiconductor region 20 sandwiched between the first semiconductor region 10 and the third semiconductor region 30.

The insulating film 60 is provided on the first surface 100a of the structural body 100. The insulating film 60 is provided continuously on the first semiconductor region 10, the second semiconductor region 20, and the third semiconductor region 30. The insulating film 60 is made of e.g. $SiO_2$.

On the insulating film 60, a control electrode G is provided. The control electrode G is provided via the insulating film 60 on part of the first semiconductor region 10, the second semiconductor region 20, and the third semiconductor region 30.

A first electrode D1 is provided on the third semiconductor region 30 and the contact region 25. The first electrode D1 constitutes e.g. a source electrode of the DiMOSFET. The first electrode D1 has e.g. a stacked structure of Al and Ni. The first electrode D1 is formed at a temperature of e.g. approximately 800° C. and ohmically connected to the contact region 25. The third semiconductor region 30 constitutes a source region of the DiMOSFET.

In the semiconductor device 110, the configuration shown in FIG. 1 is arranged in parallel in a plurality. In the semiconductor device 110, a current is passed in the entirety of the configurations arranged in parallel. Switching is performed by voltage application to the control electrode G.

Here, the second semiconductor region 20 has been subjected to ion implantation with p-type impurity (e.g., aluminum (Al)). In the second semiconductor region 20, carbon defects (C defects) are generated when this ion implantation is performed.

The C defect is stabilized if the C defect is filled with excess C. In the second semiconductor region 20, a gain of approximately 4 eV is obtained per one C defect. That is, if excess C is introduced into the MOS interface and diffused near the MOS interface, the characteristics of the MOS interface can be improved by filling C defects.

That is, in the embodiment, C defects are filled with an n-type dopant being a group V element. Immediately below the MOS interface, the n-type dopant is introduced so that the amount of n-type dopant is substantially matched with the amount of p-type dopant. Thus, a buried region 50 is provided between the second semiconductor region 20 and the first surface 100a.

In the buried region 50, the element of its outermost surface (Si for the Si surface, C for the C surface, and Si and C for the A surface) is terminated with the n-type dopant element. Thus, the dangling bonds at the surface are eliminated. This significantly improves the interface characteristics. The n-type dopant is at least one selected from the group consisting of N, phosphorus (P), and arsenic (As) among the group V elements.

In the buried region 50, the amount of n-type dopant is substantially matched with the amount of p-type dopant. Thus, the buried region 50 is a region having high insulating property. The channel provided in the second semiconductor region 20 is provided immediately below the buried region 50. Thus, the semiconductor device 110 is configured as a buried channel DiMOSFET. That is, a MOSFET having high mobility and performance is obtained.

In the buried region 50, the group V element replaces C in the substrate. Here, the buried region 50 is turned into n-type. In general, replacement of C sites by P and As is not suitable for turning into n-type. However, in the embodiment, only turning into insulator is performed by passing an electron to the p-type dopant. Thus, a buried region 50 having very good characteristics is formed. Accordingly, any of N, P, and As is suitable as n-type dopant.

Next, the function and effect of the buried region 50 are described in the following sequence.
1. Consideration on the electronic state of C defects in the SiC substrate
2. Defect generation mechanism near the substrate surface
3. Amount of carbon defects In the following description, the "SiC substrate" includes not only the substrate 15 made of SiC but also the structure in which the first semiconductor region 10, the second semiconductor region 20, and the third semiconductor region 30 are formed on the substrate 15.

[1. Consideration on the Electronic State of C Defects in the SiC Substrate]

First, the electronic state of C defects in a 4H—SiC substrate, a 6H—SiC substrate, and a 3C—SiC substrate is determined by first principle calculation. Here, the first principle calculation is based on the density functional approach using local density approximation. For Si, norm-preserving pseudopotentials are used. For substances other than Si such as C, ultrasoft pseudopotentials developed by Vanderbilt et al. are used.

Figures 2A, 2B, 2C:
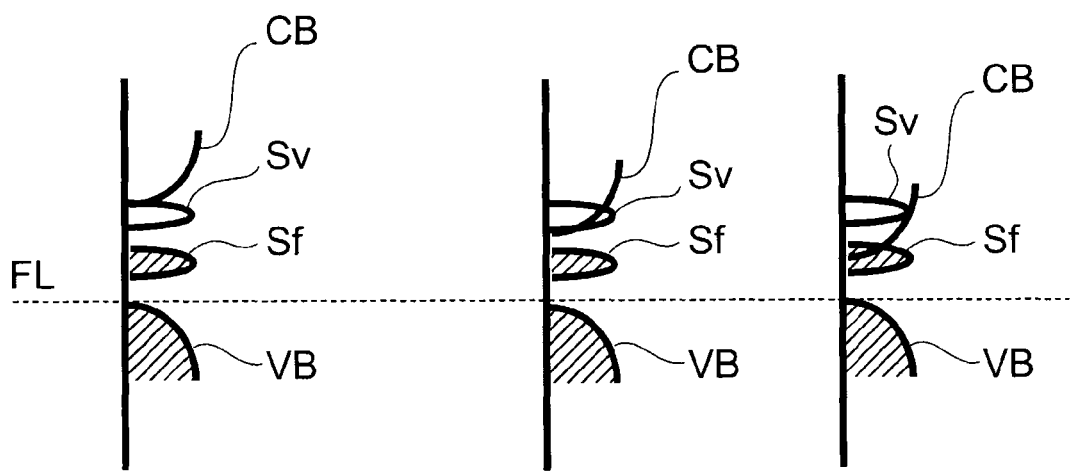
FIG. 2A to FIG. 2C are schematic views illustrating the state density of C defects.

FIGS. 2A to 2C are energy band diagrams illustrating the state density of C defects.

FIG. 2A schematically shows the state density of C defects in 4H—SiC. FIG. 2B schematically shows the state density of C defects in 6H—SiC. FIG. 2C schematically shows the state density of C defects in 3C—SiC.

If a C defect is generated in the SiC substrate, each of four Si around the C defect acquires one dangling bond. The dangling bond of Si has a state near the midpoint of the band gap of SiC.

By interaction of dangling bonds of four Si around the C defect, the state is split into two "filled states" and two "vacant states", producing a total of four states. Among them, two states (one filled state and one vacant state) appear in the gap of 4H—SiC. For the other two states, the filled state is located inside the valence band of 4H—SiC, and the vacant state is located inside the conduction band of 4H—SiC. These two states do not appear in the gap of 4H—SiC.

On the other hand, the energy position of the conduction band and the valence band vary with the structure of SiC. Thus, the positional relationship in the gap of these "filled states" and "vacant states" generated by the interaction of dangling bonds of Si depends on the structure of SiC.

As shown in FIG. 2A, in the 4H structure, a "vacant state" Sv is generated immediately below the conduction band CB. In this state, electrons are likely to be trapped. Thus, this causes the decrease of mobility.

As shown in FIG. 2C, in the 3C structure, the "filled state" Sf is related to the conduction band CB. In the 3C structure, if C defects occur, the 3C—SiC substrate itself is turned into n-type. Thus, a MOSFET fabricated from a 3C—SiC substrate is normally on. This is because, as shown in FIG. 2C, the channel portion of the n-channel MOSFET is turned into n-type.

As shown in FIG. 2B, in the 6H structure, the bottom of the conduction band CB is lowered and includes the entirety of the "vacant state" Sv. This prevents electrons from being trapped. In a MOSFET based on a 6H—SiC substrate, a high mobility is obtained. However, in the 6H structure, the bulk electron mobility is low. Thus, the 6H structure is not very suitable for a vertical MOSFET.

From the foregoing, it is found that the occurrence of C defects in the 4H—SiC substrate is one of the causes of decreasing the mobility of a MOSFET.

[2. Defect Generation Mechanism Near the Substrate Surface]

The generation energy of a defect at the surface of the SiC substrate is determined by first principle calculation. The energy needed for the generation of a C defect at the outermost surface of the C surface in the SiC substrate is 0.75 eV. The energy needed for the generation of a Si defect at the outermost surface of the Si surface in the SiC substrate is 4.6 eV. The element at the outermost surface of the SiC substrate lacking hydrogen termination has dangling bonds, and hence is placed in a high energy state. Thus, the element at the outermost surface is easily detached and generates a defect.

Near the interface between the SiC substrate and $SiO_2$ (hereinafter also simply referred to as "interface"), the internal elements (C and Si) and the defects generated at the surface are diffused while interchanging with each other. Thus, many defects are generated in the SiC substrate near the interface.

The generation energy of a defect inside the SiC substrate is also determined by first principle calculation. The energy needed for the generation of a C defect is 4.0 eV. The energy needed for the generation of a Si defect is 7.5 eV. In the SiC substrate, C defects are most likely to be generated.

Figure 3:
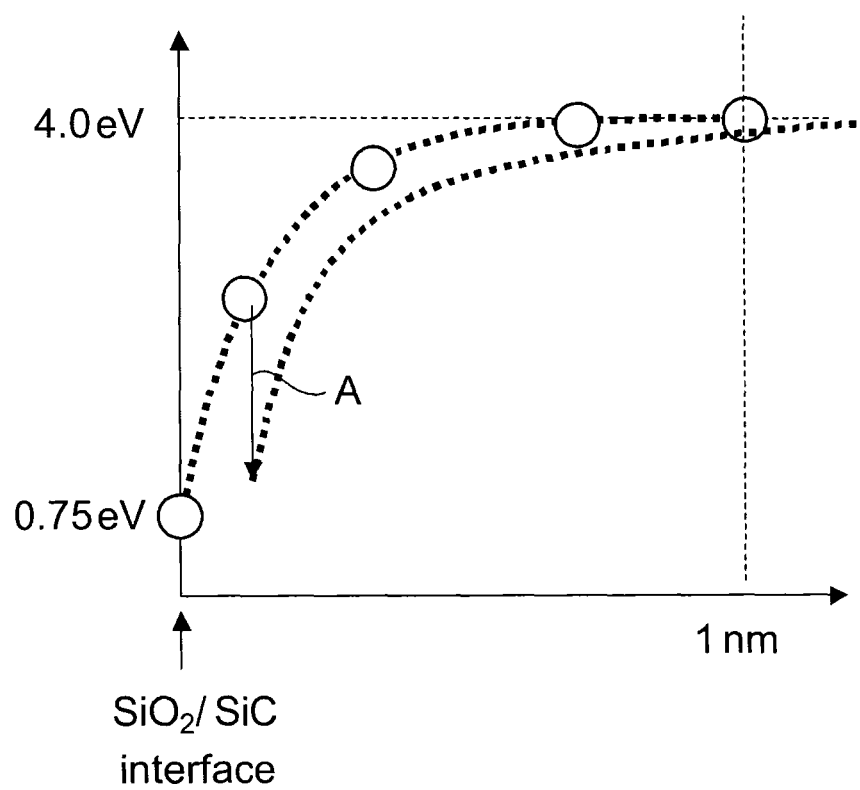
FIG. 3 illustrates the generation energy of a C defect.

FIG. 3 illustrates the generation energy of a C defect.

In FIG. 3, the horizontal axis represents the depth from the interface between the SiC substrate and $SiO_2$. The vertical axis represents the generation energy of a C defect.

As shown in FIG. 3, at the interface between the SiC substrate and $SiO_2$, the C defect is more likely to be generated than inside the SiC substrate due to the existence of dangling bonds and the effect of strain release near the interface. Furthermore, once a C defect is generated, another C defect inside that C defect becomes likely to be generated (see arrow A in the figure). This is because, as in the foregoing, strain release is facilitated by dangling bonds newly generated, i.e., a space newly produced. That is, C defects are likely to be generated near the interface. Thus, C defects are likely to be generated in the region from the interface to a depth of several nm. This portion of several nm is exactly the portion for forming a channel, and hence significantly affects the mobility.

FIGS. 4A to 4J are schematic views illustrating the formation mechanism of a C defect near the interface.

FIGS. 4A to 4E show schematic sectional views of the interface portion. FIGS. 4F to 4J show schematic views of the crystal state.

As shown in FIG. 4A, an oxygen ($O_2$) attack occurs at the surface of the SIC substrate. Then, as shown in FIGS. 4F and 4G, C is coupled to O, and C in the crystal lattice is released to the outside. Thus, a C defect is generated at the site of the released C.

As shown in FIGS. 4C and 4H, O is introduced into the C defect. Then, as shown in FIG. 4I, a $SiO_2$ cluster is generated. When the $SiO_2$ cluster is generated, volume expansion occurs.

Due to the volume expansion of the $SiO_2$ cluster, the crystal of SiC is subjected to a compressive stress. As shown in FIGS. 4D and 4I, the crystal of SiC under the compressive stress releases C in the crystal to relax the compressive stress. This is the carbon atom release mechanism in the oxidation of the SiC substrate. A C defect is generated at the site of the released C.

The released C is diffused into the SiC substrate and $SiO_2$ as an interstitial defect Ci. The number of C defects in the SiC substrate is approximately $10^{13}/cm^3$. As shown in FIG. 4E, if a $SiO_2$ film is formed, C is diffused into the SiC substrate. The diffused C is filled in the C defect formed in the SiC substrate. This decreases C defects in the SiC substrate.

The foregoing is summarized as follows.

(1) Near the interface between the SiC substrate and $SiO_2$, a large amount of carbon defects and deficiencies ($Z_{1/2}$ defects) remain. The amount of carbon defects is described later.

(2) Deep into the substrate, the $Z_{1/2}$ defect originally formed is filled with the carbon released from the interface. This decreases $Z_{1/2}$ defects.

(3) On the $SiO_2$ side, C is released in a large amount and produces charge traps such as carbon clusters (e.g., a dimer structure of carbons inserted into the oxygen site).

[3. Amount of Carbon Defects]

The generation energy of a C defect inside the SiC substrate is 4 eV. In the SiC substrate, C defects of approximately $10^{13}/cm^3$ are generated (in the case of epitaxial growth at approximately 1300° C.). Thus, if the C defect generation energy at the interface is 0.75 eV, it is considered that C defects of $10^{18}/cm^3$ are generated even at approximately room temperature. Film formation of $SiO_2$ involves a certain degree of high temperature. Thus, it is considered that C defects of approximately $10^{18}/cm^3$ are generated to a depth of approximately 3 nm from the interface.

Furthermore, there exists a process of generating a C defect involving an oxygen atom (see FIGS. 4A to 4J). More specifically, an oxygen molecule reaching the interface interacts with the dangling bond near the interface. Thus, the oxygen molecule accepts an electron and is easily decomposed into oxygen atoms. If this oxygen atom is combined with C in the SiC substrate to produce a molecule (CO), the stability is significantly increased. That is, by an oxygen atom taking C from the SiC substrate, a C defect is easily generated. This involves an energy gain of 1.5 eV per one oxygen atom. By this process, more carbon defects are generated near the interface.

Thus, at the interface between the SiC substrate and $SiO_2$, many C defects are generated. The C defects affect the mobility in a MOSFET based on the 4H—SiC substrate. In a MOSFET based on the 3C—SiC substrate, the influence appears as a phenomenon in which the channel is turned into n-type.

In the embodiment, by providing a buried region 50, the amount of C defects at the MOS interface of 4H—SiC is reduced. In the process of forming the buried region 50, C released from the surface neighborhood of the SiC substrate is filled in the C defect of the second semiconductor region 20. This decreases C defects in the second semiconductor region 20. As a result, the characteristics of the built-in diode (body diode) are improved.

C defects are generated near the surface of the SiC substrate. This C defects are replaced by n-type dopants being a group V element to form a buried region 50.

For instance, among group V elements, nitrogen (N) is introduced as n-type dopant. Then, N is coupled to the dangling bond of Si. The monoatomic layer on the outermost first surface 100a side of the buried region 50 is replaced by the group V element, and the dangling bonds are all terminated.

The termination surface of the buried region 50 may be provided not only between the second semiconductor region 20 and the first surface 100a, but also along the entire surface of the first surface 100a of the structural body 100. The surface of the buried region 50 terminated with the group V element is stabilized by three-fold coordination, and forms a surface with superior oxidation resistance.

Thus, by providing a buried region 50, C defects are suppressed in the region for forming a channel in the second semiconductor region 20. This increases the mobility. Furthermore, the threshold of the DiMOSFET is stabilized by the elimination of defects and the termination of the surface. Furthermore, by the buried region 50 thus provided, the effective amount of p-type dopant near the interface is made relatively smaller even if the total amount of p-type dopant in the second semiconductor region 20 is increased. Thus, there is little influence on the threshold even if the amount of p-type dopant is increased. On the other hand, the amount of p-type dopant in the deep portion of the second semiconductor region 20 is increased. This achieves the increases of breakdown voltage.

Second Embodiment

Next, a method for manufacturing a semiconductor device according to the embodiment is described.

Figure 5:
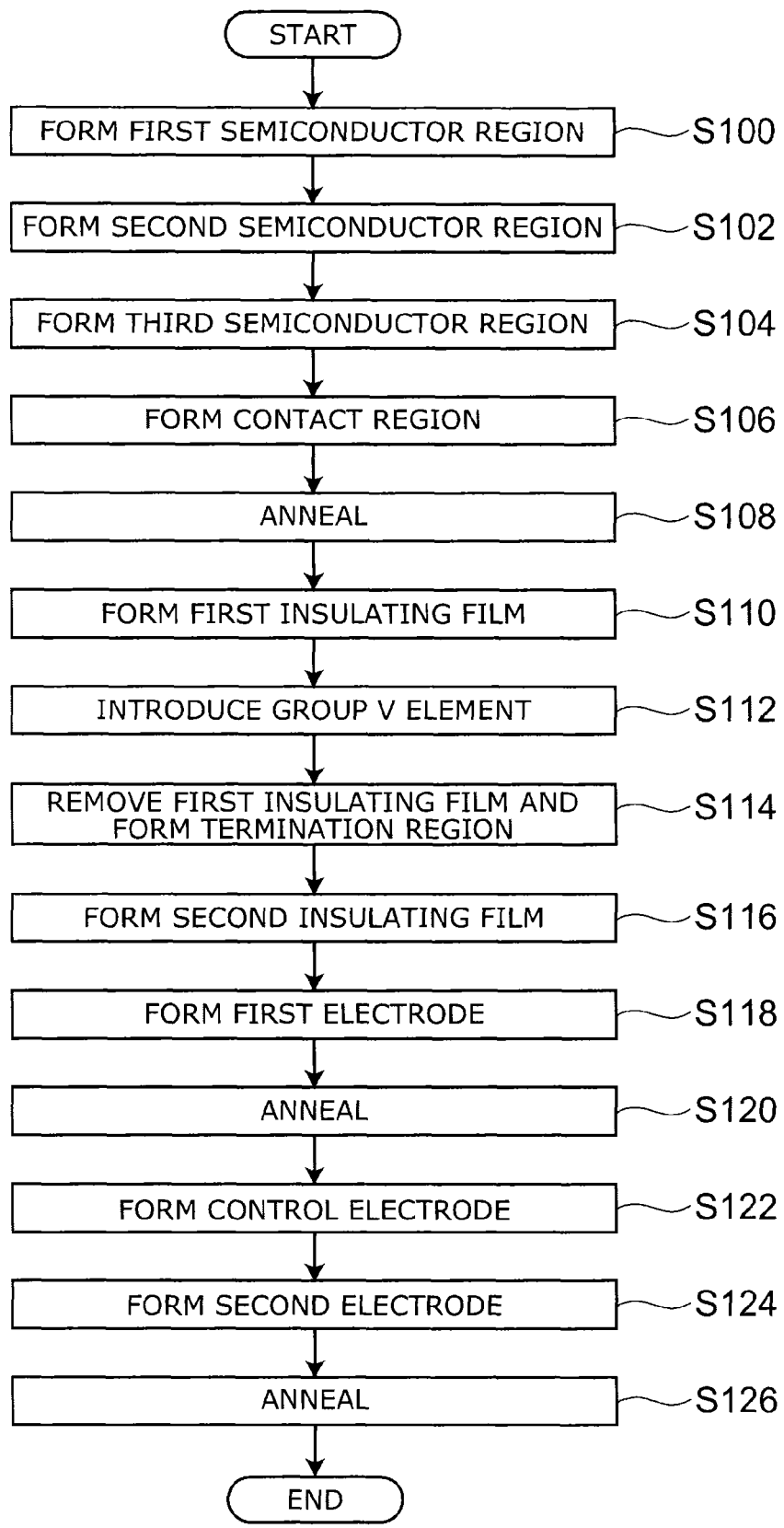
FIG. 5 is a flow chart illustrating a method for manufacturing a semiconductor device according to the embodiment.

FIG. 5 is a flow chart illustrating the method for manufacturing a semiconductor device according to the embodiment.

FIGS. 6A to 7D are schematic sectional views illustrating the method for manufacturing a semiconductor device.

As shown in FIG. 5, the method for manufacturing a semiconductor device according to the embodiment includes the step of forming a first insulating film (step S110), the step of introducing a group V element (step S112), the step of removing the first insulating film and forming a termination region (step S114), the step of forming a second insulating film (step S116), and the step of forming a first electrode (step S118).

In the following, an example of the method for manufacturing a semiconductor device is described with reference to FIGS. 5, 6A to 7D.

Figure 6A:
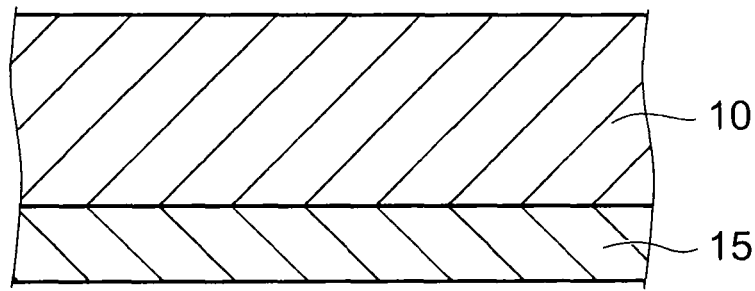
FIG. 6A to FIG. 7D are schematic sectional views illustrating the method for manufacturing a semiconductor device.

First, as shown in step S100 of FIG. 5, a first semiconductor region 10 is formed. That is, as shown in FIG. 6A, a first semiconductor region 10 including an n⁻-type 4H—SiC layer is formed on the surface of an n⁺-type 4H—SiC substrate 15. The substrate 15 is e.g. a solid monocrystalline SiC substrate.

The impurity concentration (doping concentration) in the substrate 15 is preferably $1 \times 10^{16}$ atoms/cm³ or more and less than $1 \times 10^{20}$ atoms/cm³. In the embodiment, the impurity concentration of the substrate 15 is e.g. $6 \times 10^{17}$ atoms/cm³.

The substrate 15 is preferably a hexagonal SiC substrate having a (0001) surface (4H—SiC substrate). While the (0001) surface is used in the embodiment, other surface orientations such as (000-1) surface are also effective.

The first semiconductor region 10 is formed by epitaxially growing an n⁻-type 4H—SiC layer on the surface of the substrate 15. In forming an epitaxial layer, as a raw material gas, for instance, SiH₄ gas and C₃H₈ gas are used. As an impurity (dopant), N or P is preferably used. The first semiconductor region 10 constitutes a breakdown voltage retention layer.

The film thickness of the first semiconductor region 10 is preferably e.g. 5 μm or more and 100 μm or less. For a device with higher breakdown voltage, it is preferable to make the film thickness thicker. In the embodiment, the film thickness of the first semiconductor region 10 is e.g. 10 μm. The impurity concentration (doping concentration) of the first semiconductor region 10 is preferably $8 \times 10^{14}$ atoms/cm³ or more and less than $3 \times 10^{17}$ atoms/cm³. In the embodiment, the impurity concentration of the first semiconductor region 10 is e.g. $5 \times 10^{15}$ atoms/cm³.

Figure 6B:
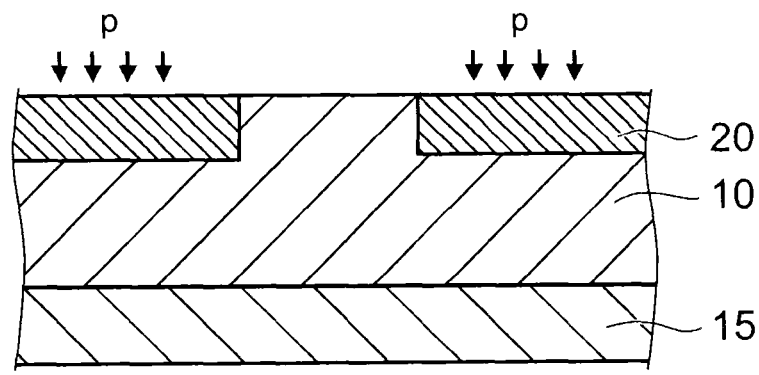

Next, as shown in step S102 of FIG. 5, a second semiconductor region 20 is formed. The second semiconductor region 20 is formed by ion implantation of p-type impurity. That is, as shown in FIG. 6B, an oxide film (not shown) is formed using photolithography and etching. The oxide film is used as a mask to selectively implant an impurity of p-type conductivity into the surface region of the SiC layer being the first semiconductor region 10. Thus, a second semiconductor region 20 including a p⁻-type 4H—SiC region is formed.

In general, the concentration of conductive impurity in the second semiconductor region 20 is e.g. $1 \times 10^{16}$ atoms/cm³. The condition for implantation of Al ions serving as p-type impurity is that, for instance, the dose amount is $1 \times 10^{15}$ atoms/cm², and the energy is 80 keV. In the embodiment, the above ion implantation is performed with the substrate 15 heated to e.g. 300° C. That is, in general, the concentration of conductive impurity in the second semiconductor region 20 is preferably $1 \times 10^{13}$ atoms/cm³ or more and $5 \times 10^{17}$ atoms/cm³ or less. More preferably, it is $1 \times 10^{15}$ atoms/cm³ or more and $5 \times 10^{16}$ atoms/cm³ or less.

However, in the embodiment, the p-concentration of the second semiconductor region is set to approximately $1 \times 10^{18}$ atoms/cm³ or more and $1 \times 10^{19}$ atoms/cm³ or less. This is because it enables breakdown voltage control. However, this alone results in a very large threshold. After the process of the embodiment, the group V element is diffused from the insulating film side into the channel region. Thus, the effective doping amount in the channel region decreases to $1 \times 10^{16}$ atoms/cm³. Accordingly, a MOSFET having a normal threshold is formed.

Figure 8:
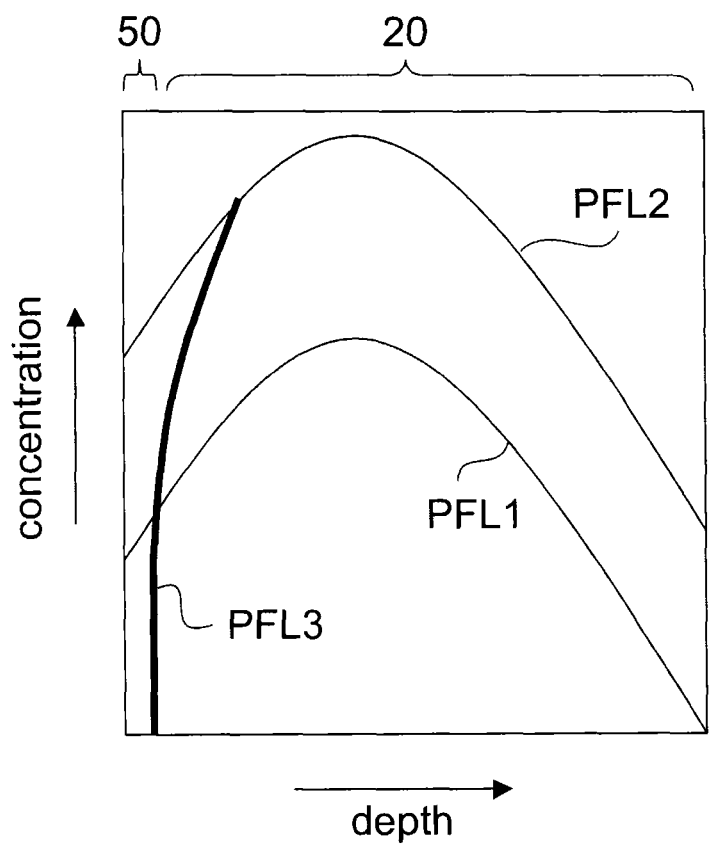
FIG. 8 illustrates an effective p-concentration profile.

FIG. 8 illustrates a p-concentration profile.

In FIG. 8, the horizontal axis represents the depth direction of the semiconductor region. The vertical axis represents p-concentration. The profile PFL1 shown in FIG. 8 represents a concentration profile for a normal doping amount. In the embodiment, the concentration exhibits the profile PFL2 with the doping amount larger than normal. Furthermore, on the front surface side of the second semiconductor region 20, the group V element is diffused from the insulating film side. Thus, the concentration exhibits the profile PFL3 with the p-concentration decreased.

Thus, in the embodiment, the front surface side of the second semiconductor region 20 exhibits the profile PFL3, and the deep portion exhibits the profile PFL2. That is, on the front surface side of the second semiconductor region 20, the increase of the threshold is suppressed by low p-concentration. On the other hand, in the deep portion of the second semiconductor region 20, the increase of the breakdown voltage is achieved by high p-concentration.

Figure 6C:
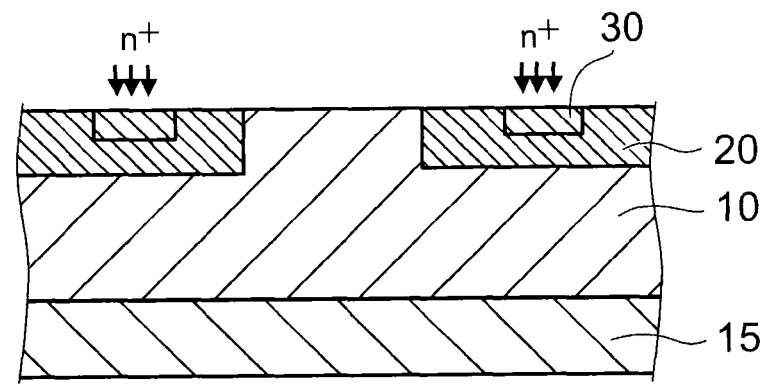

Next, as shown in step S104 of FIG. 5, a third semiconductor region 30 is formed. The third semiconductor region 30 is formed by ion implantation of n-type impurity. That is, as shown in FIG. 6C, n-type conductive impurity is selectively implanted into a portion of the surface of the second semiconductor region 20. Thus, a third semiconductor region 30 including an n⁺-type 4H—SiC region is formed.

Specifically, the mask of oxide film used to form the second semiconductor region 20 is removed. Then, another mask of oxide film (not shown) having a new pattern is formed using photolithography and etching. Then, n-type conductive impurity is implanted through the opening of the new mask. Thus, a third semiconductor region 30 is formed.

The concentration of conductive impurity in the third semiconductor region 30 is e.g. $2 \times 10^{20}$ atoms/cm³. The condition for implantation of N ions serving as n-type impurity is that, for instance, the dose amount is $1 \times 10^{15}$ atoms/cm², and the energy is 40 keV. In the embodiment, the above ion implantation is performed with the substrate 15 heated to 300° C. The concentration of conductive impurity in the third semiconductor region 30 is preferably $1 \times 10^{14}$ atoms/cm³ or more and $5 \times 10^{20}$ atoms/cm³ or less. More preferably, it is $5 \times 10^{15}$ atoms/cm³ or more and $3 \times 10^{20}$ atoms/cm³ or less.

Figure 6D:
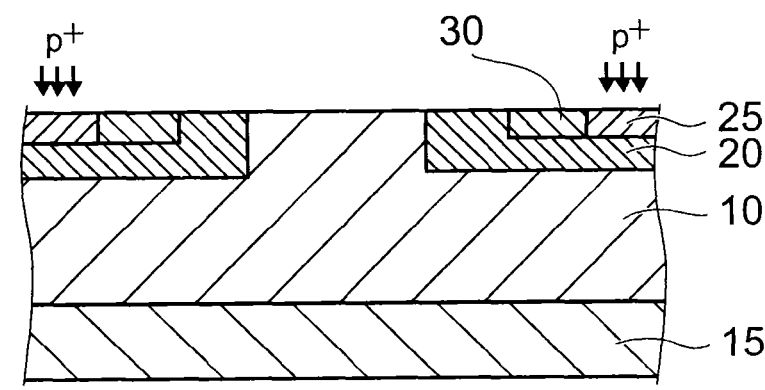

Next, as shown in step S106 of FIG. 5, a contact region 25 is formed. The contact region 25 is formed by ion implantation of p-type impurity. That is, as shown in FIG. 6D, p-type conductive impurity is selectively implanted into another portion of the surface of the second semiconductor region 20 adjacent to the third semiconductor region 30. Thus, a contact region 25 including a p⁺-type 4H—SiC region is formed.

Specifically, the mask of oxide film used to form the third semiconductor region 30 is removed. Then, another mask of oxide film (not shown) having a new pattern is formed using photolithography and etching. Then, p-type conductive impurity is implanted through the opening of the new mask. Thus, a contact region 25 is formed.

The concentration of conductive impurity in the contact region 25 is e.g. $2 \times 10^{20}$ atoms/cm³. The condition for implantation of Al ions serving as p-type impurity is that, for instance, the dose amount is $1 \times 10^{15}$ atoms/cm², and the energy is 40 keV. In the embodiment, the above ion implantation is performed with the substrate 15 heated to 300° C. The concentration of conductive impurity in the contact region 25 is preferably $1 \times 10^{14}$ atoms/cm³ or more and $5 \times 10^{20}$ atoms/cm³ or less. More preferably, it is $5 \times 10^{15}$ atoms/cm³ or more and $3 \times 10^{20}$ atoms/cm³ or less.

Next, as shown in step S108 of FIG. 5, annealing is performed. That is, after the above ion implantation steps, an activation annealing treatment is performed. For instance, this activation annealing treatment is performed using argon (Ar) gas as an atmosphere gas under the condition that the heating temperature is 1600° C., and the heating time is 30 minutes. Thus, the structure shown in FIG. 6D is obtained. Here, the dopant introduced into the SiC substrate is activated, but scarcely diffused.

In forming the second semiconductor region 20, the third semiconductor region 30, and the contact region 25, carbon ions may be codoped. In this case, by the high temperature annealing shown in step S108, excess carbon ions are diffused to the first semiconductor region 10, the substrate 15, and the outside, and do not remain in the second semiconductor region 20. As a result, the characteristics change of the MOS interface at this stage depending on the presence and absence of codoping of carbon ions is unobservable.

Next, as shown in step S110 of FIG. 5, a first insulating film is formed. That is, after the ion implantation steps and the activation annealing treatment described above, as shown in FIG. 7A, a first insulating film 61 is formed. The first insulating film 61 is made of $SiO_2$. The film thickness of the first insulating film 61 is 5 nm or less. The first insulating film 61 is formed by e.g. thermal oxidation and wet oxidation. The condition for thermal oxidation is that, for instance, the temperature is 1200° C., and the heating time is 5 minutes. The condition for wet oxidation is that, for instance, the temperature is 900° C., and the oxidation time is 5 minutes.

In oxidation for forming the first insulating film 61, if $O_2$ attack occurs at the surface of the SiC substrate, many C defects are formed near the surface of the SiC substrate. With the progress of oxidation, a $SiO_2$ is formed. Then, the crystal of the SiC substrate releases C under a compressive stress from the $SiO_2$ film. This released C is filled in the C defect inside the SiC substrate (e.g., inside the second semiconductor region 20). Thus, C defects inside the SiC substrate are suppressed. On the other hand, many C defects are formed near the interface between the SiC substrate and $SiO_2$ (first insulating film 61).

Figure 7A:
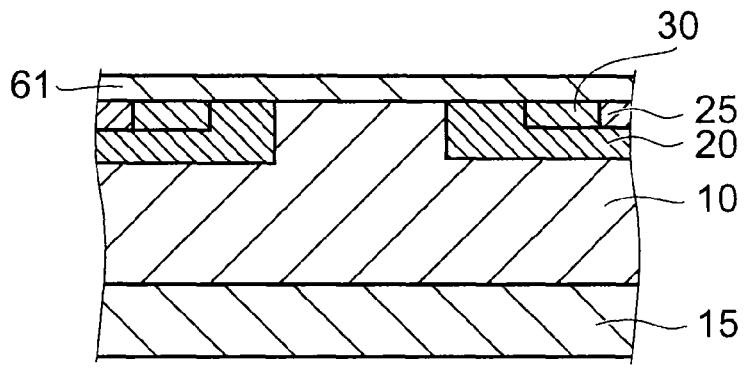
Figure 7B:
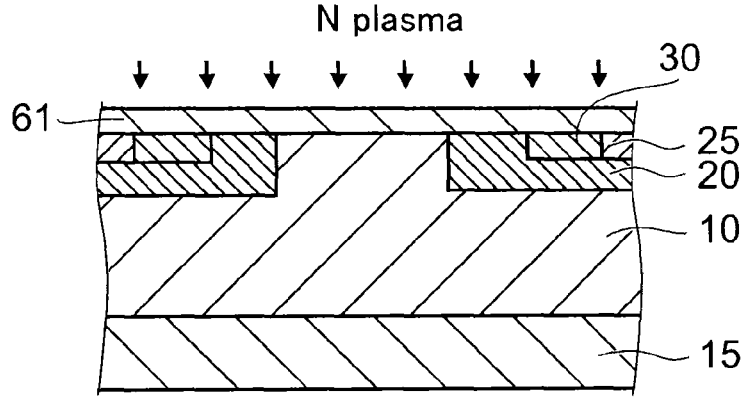

Next, as shown in step S112 of FIG. 5, a treatment for introducing a group V element is performed. In the embodiment, N is used as the group V element. As shown in FIG. 7B, plasma nitridation under low pressure is performed through the first insulating film 61. In the plasma nitridation under low pressure, the first insulating film 61 is a film as thin as 5 nm or less. Thus, N is not only introduced into the first insulating film 61, but also passes through the first insulating film 61 and reaches the SiC substrate below the first insulating film 61. N having reached the SiC substrate is filled in the C defect formed in the SiC substrate.

Figure 9A:
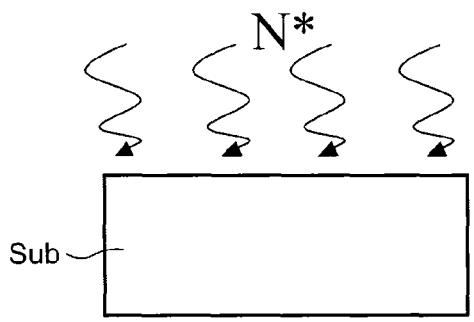
FIG. 9A to FIG. 9F illustrate the states of plasma nitridation.
Figure 9B:
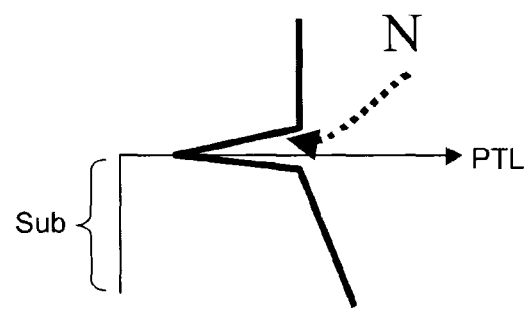

FIGS. 9A to 9F illustrate the states of plasma nitridation. FIG. 9A illustrates the state of the SiC substrate Sub directly nitridized. FIG. 9B illustrates a potential PTL experienced by N in the case of the SiC substrate Sub directly nitridized. If the SiC substrate Sub is directly nitridized, a high density silicon nitride film is formed at the surface. Thus, N cannot be diffused into the SiC substrate Sub.

Figure 9C:
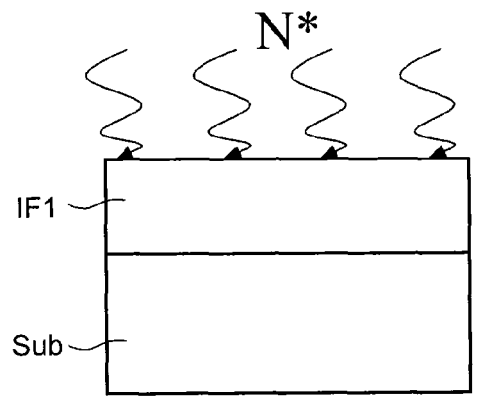
Figure 9D:
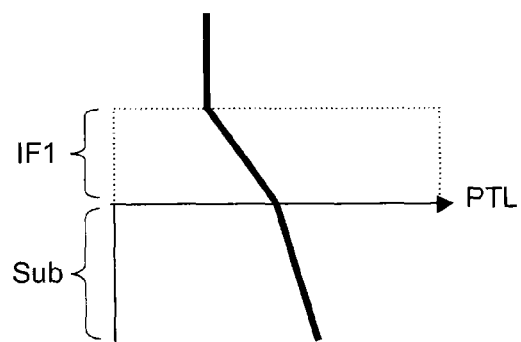

FIG. 9C illustrates the state of nitridation from above a thick insulating film IF1. FIG. 9D illustrates a potential PTL experienced by N in the case of nitridation from above a thick insulating film IF1. In the case of nitridation from above a thick insulating film IF1, only the insulating film IF1 is nitridized, and N scarcely reaches the SiC substrate Sub.

Figure 9E:
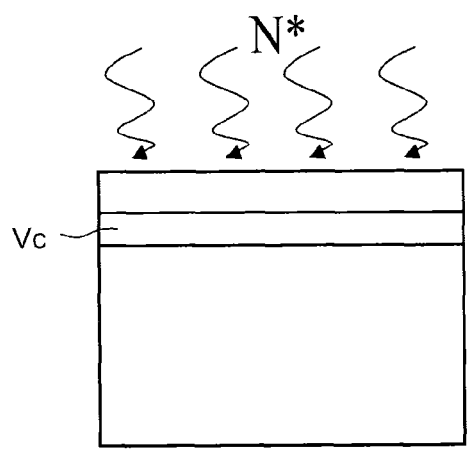
Figure 9F:
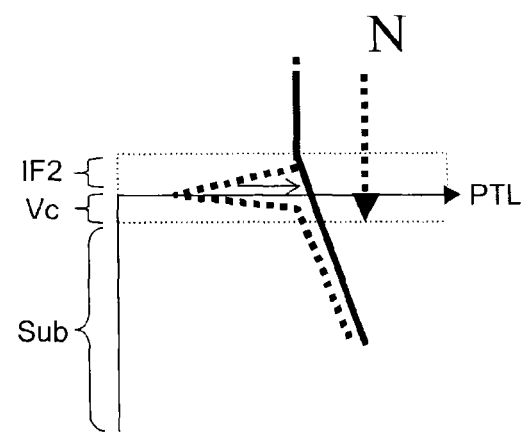

FIG. 9E illustrates the state of nitridation from above an ultrathin insulating film IF2. FIG. 9F illustrates a potential PTL experienced by N in the case of nitridation from above an ultrathin insulating film IF2. The state of nitridation shown in FIGS. 9E and 9F is obtained by the process of the embodiment. An ultrathin insulating film IF2 is formed on the SiC substrate Sub to deform the potential experienced by N. Furthermore, N is slowly delivered to the interface under low pressure. Thus, N is diffused into the SiC substrate Sub. Conventionally, it is difficult to introduce N into the SiC substrate Sub. However, in the embodiment, N is introduced into the SiC substrate Sub to realize a special structure.

Figure 7C:
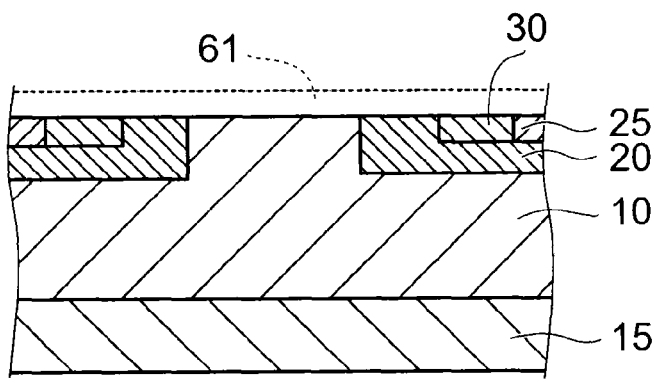

Next, as shown in step S114 of FIG. 5, the first insulating film is removed, and a termination region is formed. That is, as shown in FIG. 7C, the first insulating film 61 is removed by etching. When the first insulating film 61 is removed by etching, N in the first insulating film 61 is driven to the SiC substrate side. Then, by the removal of the first insulating film 61, N is coupled to the dangling bond formed at the surface of the SiC substrate (e.g., dangling bond of Si). Thus, a structure terminated with N is formed at the surface of the SiC substrate. This termination structure has three-fold coordination based on N, and hence is a stable termination structure of the substitution type. Thus, the surface termination of the buried region 50 is formed. The thickness of the buried region 50 is e.g. 2 nm or more and 5 nm or less.

In the embodiment, in the introduction of N performed in step S112, N is introduced so that the amount of N in the buried region 50 is substantially matched with the amount of p-type dopant in the second semiconductor region 20. Thus, a buried region 50 having high insulating property is obtained between the second semiconductor region 20 and the first surface 100a.

Figure 7D:
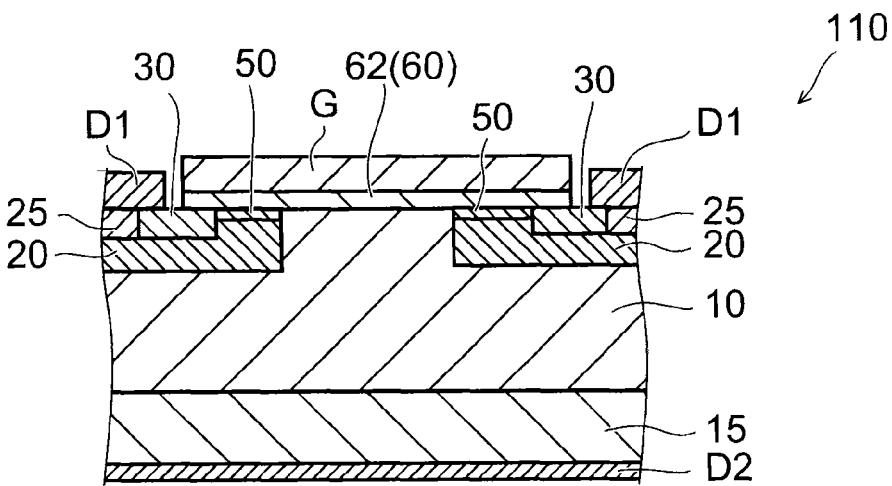

Next, as shown in step S116 of FIG. 5, a second insulating film is formed. The second insulating film is a gate insulating film (insulating film 60). That is, as shown in FIG. 7D, an insulating film 60 being a second insulating film is formed so as to entirely cover the surface of the first semiconductor region 10, the second semiconductor region 20, and the third semiconductor region 30. The insulating film 60 is made of e.g. $SiO_2$. Alternatively, the insulating film 60 may be made of SiN or high dielectric material (high-k material). The method for forming the insulating film 60 is a deposition method such as CVD.

Next, as shown in step S118 of FIG. 5, a first electrode D1 is formed. The first electrode D1 is e.g. a source electrode. To form a first electrode D1, first, a patterned resist film (not shown) is formed on the insulating film 60 using photolithography technique. Then, using the resist film as a mask, the portion of the insulating film 60 located on the surface of the contact region 25 and part of the surface of the third semiconductor region 30 is removed by etching.

Thus, an opening is formed by this resist film and the removal of the insulating film 60. Then, a conductive film made of e.g. metal is formed on the surface of the contact region 25 and the part of the surface of the third semiconductor region 30 exposed through the opening. This conductive film constitutes a first electrode D1.

Then, the resist film is removed. Thus, the conductive film located on the resist film is removed (lift-off). Furthermore, the width of the insulating film 60 can be narrowed by e.g. etch-back. Then, a gap is formed so as to avoid contact between the insulating film 60 and the first electrode D1. Here, the conductor constituting the first electrode D1 is preferably e.g. nickel (Ni).

Next, as shown in step S120 of FIG. 5, annealing is performed. That is, after forming the first electrode D1, as an annealing step, heat treatment at e.g. 800° C. is performed. For instance, heat treatment is performed in argon (Ar) gas for a heating time of 5 minutes.

By the above heat treatment, a first electrode D1 including $Ni_2Si$ is formed. A large amount of N has been introduced into the third semiconductor region 30. Thus, by this annealing treatment, an electrode structure having low contact resistance is obtained. Furthermore, a large amount of Al has been introduced into the contact region 25. Thus, a contact having low contact resistance is easily obtained.

Next, as shown in step S122 of FIG. 5, a control electrode G is formed. That is, as a step for forming a control electrode G, a control electrode G is formed on the insulating film 60. The control electrode G is made of e.g. n-type polysilicon.

Here, the first electrode D1 may also be made of n-type polysilicon. Then, a Ni film may be further formed and heat treated to form a salicide film of e.g. NiSi, $Ni_2Si$, or $NiSi_2$ as both the first electrode D1 and the control electrode G.

Next, as shown in step S124 of FIG. 5, a second electrode D2 is formed. The second electrode D2 is e.g. a drain electrode. The second electrode D2 is formed on the rear surface of the substrate 15. The second electrode D2 is made of e.g. a stacked structure of Ni and Ti. The second electrode D2 is provided on e.g. the entire surface of the rear surface of the substrate 15.

Next, as shown in step S126 of FIG. 5, annealing is performed. In this annealing treatment, heat treatment at approximately 800° C. is performed. The condition for this annealing treatment is that, for instance, annealing is performed in argon (Ar) gas for a heating time of 5 minutes. By this heat treatment, $Ni_2Si$, for instance, is formed at the interface between the second electrode D2 and the substrate 15. Thus, the second electrode D2 is ohmically connected to the substrate 15.

By the foregoing process, the semiconductor device 110 is completed.

The features of the method for manufacturing the semiconductor device 110 according to the embodiment are now described in the following sequence.
1. Filling carbon defects in the SiC substrate with nitrogen
2. Role of thin film $SiO_2$
3. Significance of the fabrication of thin film $SiO_2$
4. Nitrogen pile-up onto the interface
5. Details of the nitrogen termination structure
6. Oxidation resistance
7. XPS experiment of the termination surface
8. Charge storage region
9. Interface formation using doped polysilicon
10. Selection of elements
11. C defect sites and amount thereof <1. Filling Carbon Defects in the SiC Substrate with Nitrogen>

In the embodiment, after forming the first insulating film 61, C defects immediately below the interface between the first insulating film 61 and the SiC substrate are filled with N atoms. Specifically, before the step of forming the gate insulating film of the vertical DiMOSFET based on the 4H—SiC substrate, thin film $SiO_2$ (first insulating film 61) is formed and exposed to low pressure nitrogen plasma. Thus, N atoms are diffused into the SiC substrate. Accordingly, C defects are filled with N atoms.

In forming this $SiO_2$ (first insulating film 61), a large amount of C defects are formed. Furthermore, by the formation of $SiO_2$, the degree of freedom of migration in the direction vertical to the SiC substrate surface is lost, and N is diffused into the substrate. Because the $SiO_2$ (first insulating film 61) is thin, N reaches the SiC substrate.

<2. Role of Thin Film $SiO_2$>

In introducing N, if the film thickness of $SiO_2$ is thick, nitrogen scarcely reaches the SiC interface. In this case, only the upper surface of the $SiO_2$ film is nitridized.

In the case where the SiC substrate is directly exposed to nitrogen plasma without providing the insulating film 61, only the surface of the SiC surface is nitridized. The silicon nitride film has high density. Thus, if the silicon nitride film is formed, N cannot be diffused into the SiC substrate.

In the embodiment, $SiO_2$ as thin as approximately 5 nm or less is formed. In this case, a large amount of N atoms are diffused to the SiC interface. Thus, C defects in the SiC substrate are filled with nitrogen. In the region where a channel is conventionally formed, the region immediately below the interface between $SiO_2$ and the SiC substrate is turned into insulating film by interaction with p-type dopant such as aluminum. Introduction of N into the C defect site produces an excess electron, which is accepted by p-type dopant such as Al. This gives a gain corresponding to the energy of electron transfer. This gain serves as a driving force for turning into insulating film.

<3. Significance of the Fabrication of Thin Film $SiO_2$>

The significance of fabricating the first insulating film 61 made of thin film $SiO_2$ can be pointed out in the following three points.

(1) Interface planarization is realized by suitably combining thermal oxidation and wet oxidation.

(2) In this process, C defects are sufficiently formed. With sufficient C defects, by adjusting the amount of p-type dopant such as Al, the interface portion is turned into insulating film. Thus, preferably, there are a larger amount of C defects. In the normal MOS development process, adjustment by p-type dopant is not considered. In this case, it is desirable that C defects be as few as possible. However, the embodiment uses a process unsuitable for such a normal process.

(3) In the process of creating C defects, C fills C defects inside the SiC substrate. Thus, the electron lifetime is significantly prolonged. This is very effective in such a case of using the body diode based on p/n junction as a freewheeling diode for the backflow of reverse current. That is, in the embodiment, at the stage of forming the first insulating film 61 made of thin film $SiO_2$, the SiC substrate is actively oxidized to create C defects. The embodiment is different from the conventional process in actively forming and utilizing C defects.

<4. Nitrogen Pile-Up onto the Interface>

In the process of turning into insulating film, N is piled up at the interface. N piled up in a large amount is turned into an interface nitride film and has high density. This prevents more N from penetrating therethrough and reaching the SiC substrate.

Thus, diffusion of N into the SiC substrate is stopped. Further exposition to nitrogen plasma only results in nitridizing the upper SiON film.

A channel is formed immediately below this film turned into insulating film. Also in that channel region, a certain amount of nitrogen is diffused. Initially, p-type dopant such as Al is introduced in a larger amount than conventional. Then, the diffused N decreases the effective amount of p-type dopant. This prevents the threshold from being excessively increased.

<5. Details of the Nitrogen Termination Structure>

After the portion immediately below the interface is turned into insulating film as described above, the SiC substrate interface is terminated with a large amount of N atoms. Here, the first insulating film 61 made of thin film $SiO_2$ is turned into a thin oxynitride film. This oxynitride film is treated with dilute hydrofluoric acid at a concentration of approximately 1%. Then, the oxynitride film is removed. This results in a special structure in which the SiC substrate surface is completely N terminated.

The special surface structure thus formed is very stable and superior in oxidation resistance compared with e.g. the conventional hydrogen terminated surface. This structure is a special structure in which the outermost surface element is replaced by N.

At the Si surface of SiC, the outermost surface Si is replaced. At the C surface, the outermost surface C is replaced. At the A surface with (11-20) orientation, Si and C at the outermost surface are both replaced by N.

Here, "completely terminated" means that almost all the outermost surface elements are replaced. At the Si surface, one monoatomic layer (one monolayer) of Si is terminated with N. At the C surface, one monolayer of C is terminated with N.

The surface density is approximately $2.4 \times 10^{15}/cm^2$. However, actually, there is a measurement error of approximately ±20%. Thus, it may be considered that the surface density is approximately $1.9 \times 10^{15}/cm^2$ or more and $2.9 \times 10^{15}/cm^2$ or less. At the A surface, the outermost surface is composed of Si and C. These outermost surface elements are terminated with N. Also in this case, with the measurement error taken into consideration, replacement corresponding to a monolayer occurs.

Such a termination structure is extremely difficult to form, and cannot be formed by a nitridation process mixed with oxygen such as NO nitridation. Furthermore, also in the plasma nitridation process, if the nitridation process is contaminated with even a fraction of oxygen (e.g., even at the ppm level), oxygen causes reaction. Oxygen preferentially acts on and oxidizes the interface. Furthermore, in the plasma nitridation process, under the normal condition, interface nitridation occurs instead of interface termination.

The embodiment utilizes the following points. (1) After oxidizing the SiC substrate, nitrogen is delivered to the SiC substrate and concentrated on the interface. (2) The oxynitride film at the oxygen-containing interface is dissolved into dilute hydrofluoric acid. (3) The termination structure replaced by nitrogen is very stable. If the thin oxynitride film at the surface of the SiC substrate is treated with dilute hydrofluoric acid, N in the film is replaced by the outermost surface element of the SiC substrate and stabilized. Thus, a surface termination structure is formed in the buried region 50.

Furthermore, N exists so sufficiently that the surface of the SiC substrate is turned into insulating film. Thus, almost all the outermost surface elements are replaced by N. Accordingly, a SiC substrate surface being very stable and superior in oxidation resistance is formed.

Conventionally, the amount of N is absolutely insufficient. Even if treated with dilute hydrofluoric acid, although the outermost surface elements are partly terminated, most of the outermost surface elements remain intact. Then, the outermost surface elements present dangling bonds, or are terminated with hydrogen.

Here, if thermal oxidation is performed, an oxide film is again easily formed. Even if TEOS or the like is deposited, water produced by decomposition acts as an oxidizing agent and advances the oxidation of the interface. In the embodiment, the buried region 50 based on N has very good oxidation resistance, and hence thermal oxidation scarcely proceeds. Even if TEOS is deposited and annealed for densification at a temperature exceeding 700° C., the oxidation of the interface does not proceed.

<6. Oxidation Resistance>

Then, a gate oxide film (second insulating film 62) is deposited by e.g. CVD. The second insulating film 62 is formed from e.g. TEOS film. Conventionally, deposition of oxide film alone results in considerably oxidizing the interface. Thus, C defects occur immediately below the interface, and the carbon is diffused to the insulating film side. This generates charge traps such as C defects in the SiC substrate, carbon in the insulating film, and interface dangling bonds. Thus, the mobility degradation occurs.

In the embodiment, the oxidation resistance of the SiC substrate surface is improved. Thus, after the surface termination structure is formed in the buried region 50, the generation of C defects in the SiC substrate is suppressed. As a result, diffusion of carbon into the gate insulating film is less likely to occur. Furthermore, dangling bonds are also suppressed by the stable surface termination structure of the buried region 50.

Thus, in the embodiment, (1) the amount of C defects in the SiC substrate is small. (2) The portion immediately below the interface is turned into insulating film to form a buried channel. (3) The amount of dopant in the channel is appropriately suppressed to enable operation at a suitable threshold. (4) The amount of dangling bonds at the interface is incommensurably smaller than conventional. (5) Carbon diffusion into the gate insulating film is suppressed, and hence charge traps due to carbon are less likely to occur. Furthermore, as described later, (6) a high concentration $n^+$-layer (charge storage region 55) is formed between the channels. This ensures a sufficient amount of charge and reduces the JFET resistance. (7) The amount of p-type dopant in the base portion can be made sufficiently large. This suppresses leakage due to punch-through.

<7. XPS Experiment of the Termination Surface>

For instance, XPS (X-ray photoelectron spectroscopy) experiment is performed on the Si surface of the SiC substrate. X-rays are applied parallel to the surface of the buried region 50. Then, it is found that the surface is covered with C—N bonds. At the Si surface of the buried region 50 where the surface termination structure is not formed, many Si dangling bonds and Si—H bonds are observed.

When X-rays are applied perpendicular to the surface of the buried region 50, Si—N bonds are observed. This means that N is diffused into the internal C defects. At the Si surface where the buried region 50 is not formed, no Si—N bonds are observed. At the C surface, when X-rays are applied parallel to the surface of the buried region 50, Si—N bonds are observed. This means that N replaces the outermost surface element.

<8. Charge Storage Region>

Conventionally, the region between the channels formed is an n-type low concentration region. However, in the embodiment, N is diffused immediately below the interface to form an n-type high concentration region (charge storage region 55). Thus, when a voltage is applied to the positive electrode, charge is more likely to be accumulated, and the flowing current is increased. This ensures a sufficient amount of charge and reduces the JFET resistance.

Also in this charge storage region 55, the group V element replaces C in the substrate. Here, the n-type concentration in the charge storage region 55 is made higher. In general, replacement of C sites by P and As is not suitable for turning into n-type. However, in the embodiment, production of a large amount of charge is important. The embodiment is not affected by a certain difference in energy level. Accordingly, any of N, P, and As is suitable as n-type dopant.

<9. Interface Formation Using Doped Polysilicon>

In the example described in the above manufacturing method, thin film $SiO_2$ is formed, and N is introduced by a plasma nitridation process. However, other methods may also be used. For instance, thin film polysilicon doped with n-type impurity, such as P-doped thin film polysilicon, As-doped thin film polysilicon, and N-doped thin film polysilicon, may be formed on the surface of the SiC substrate. In this case, n-type impurity such as P, As, and N is diffused into C defects formed in the process of oxidizing this polysilicon, and fills the C defects.

Then, the produced oxide film is removed with dilute hydrofluoric acid. Thus, a buried region 50 based on P, As, and N having superior oxidation resistance is formed. Subsequently, a gate insulating film is formed as in the foregoing. Thus, a good MOS interface with interface traps suppressed is formed.

<10. Selection of Elements>

In view of the stability of the termination structure in the buried region 50, at the Si surface, P, As, and N are effective in this order. At the C surface, N, P, and As are effective in this order. At the A surface, the termination structure is most stable when the ratio of [amount of N]:[amount of P+As] is equal to 1:1. However, at the A surface, a surface superior in oxidation resistance is obtained even if terminated with e.g. only N or only P, as long as termination is performed at the substantially entire surface.

In the final structure of the SiC semiconductor device subjected to the process of the embodiment, the amount of C defects immediately below the interface is incommensurably smaller than conventional. Furthermore, immediately below the interface, the amount of N is substantially matched with the amount of p-type dopant. Thus, the buried region 50 has high insulating property. Accordingly, the SiC semiconductor device is a buried channel MOSFET in which a channel is formed below the buried region 50.

Furthermore, as described above, reflecting the improvement of interface characteristics, the interface level density is incommensurably decreased. As a result, the mobility achieves a sufficiently large value of approximately 200-450 $cm^2/Vs$. Typically, this is comparable to that of the buried channel at the interface between Si and $SiO_2$ (approximately 400 $cm^2/Vs$).

The mobility of 200 $cm^2/Vs$ occurs in the case of partly omitting the process such as omitting the process of removing the thin oxynitride film. In this case, the complete termination structure of the interface is not formed, and hence the mobility is degraded.

The mobility of 450 $cm^2/Vs$ may be considered to be the upper limit for the case of fabricating a buried channel at the normal interface between SiC and $SiO_2$. That is, the mobility of 450 $cm^2/Vs$ occurs in the case of including the buried channel structure, the interface termination structure, and the charge storage structure. With regard to the interface termination, the mobility is maximized in the case where Si is replaced by P, and C is replaced by N.

<11. C Defect Sites and Amount Thereof>

N is introduced into C defects by diffusion. C defects are distributed mostly to 3 nm or less in the channel depth direction. Thus, once N is introduced into the substrate, N can be easily diffused to approximately 3 nm. The interaction between the C defect and N is feasible to approximately 2 nm. Thus, N is diffused to approximately 5 nm.

Conventionally, the concentration of p-type dopant in the channel portion is approximately $10^{16}$ atoms/$cm^3$. However, this results in excessively low concentration of p-type dopant in the base portion, and may cause leakage current due to punch-through.

In the embodiment, the first insulating film 61 is formed. Then, C defects are formed in an amount of approximately $10^{18}/cm^3$ or more and $10^{19}/cm^3$ or less. In conformity with that amount, the amount of p-type dopant is adjusted. Then, N is introduced into C defects, and its amount is matched with the amount of p-type dopant. Because C defects are diffused, the buried region 50 is formed so that the amount of N is substantially matched with the amount of p-type dopant in a thickness of approximately 2 nm or more and 5 nm or less near the interface.

The amount of C defects decreases from immediately below this buried region 50 to the inside of the SiC substrate (second semiconductor region 20). Because N is introduced into C defects, the amount of p-type dopant immediately below the buried region 50 is approximately $10^{16}/cm^3$. This value determines the threshold. Typically, p-type dopant of $2\times10^{16}$ atoms/$cm^3$ is active, and the threshold is approximately 4 V.

In the base portion of the SiC substrate (second semiconductor region 20), the concentration of p-type dopant is approximately $10^{18}$ atoms/$cm^3$ or more and $10^{19}$ atoms/$cm^3$ or less. This sufficiently suppresses the occurrence of leakage current due to punch-through.

Thus, the embodiment achieves compatibility between low threshold and leakage current suppression.

Third Embodiment

Figure 10:
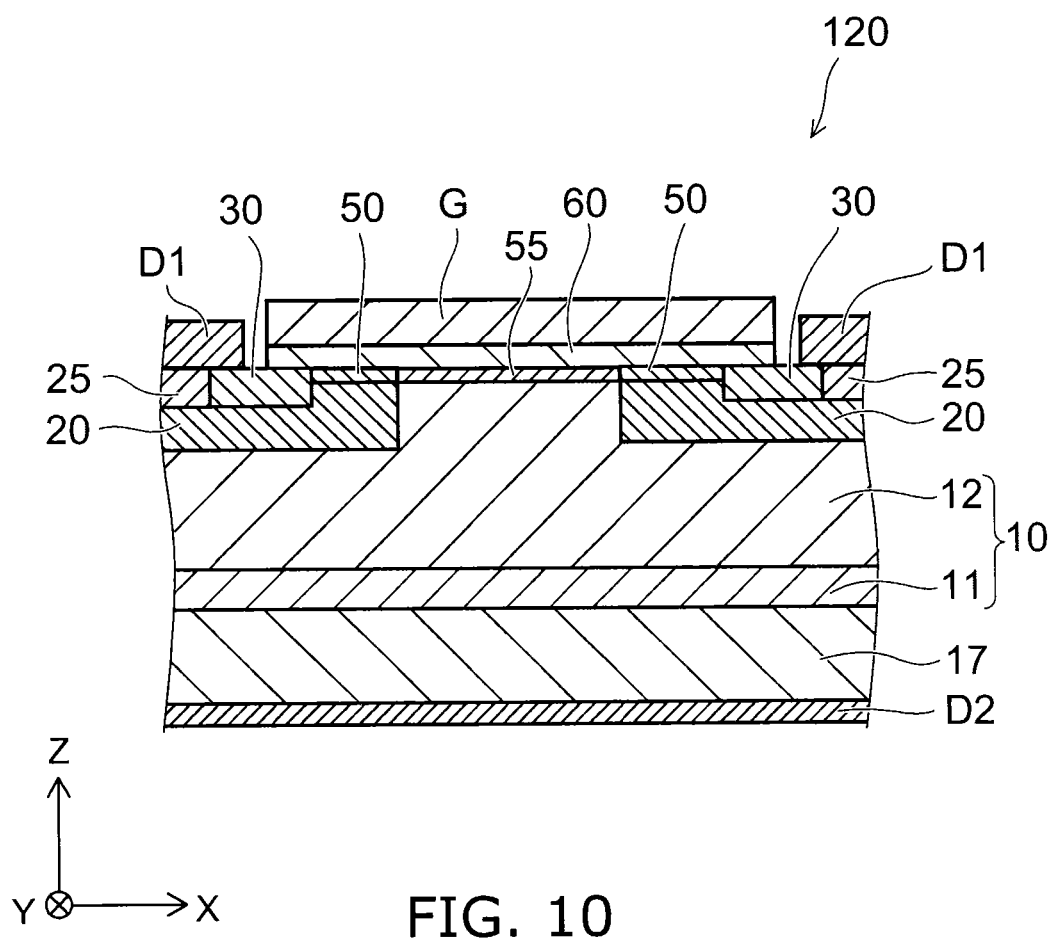
FIG. 10 is a schematic sectional view illustrating a semiconductor device according to a third embodiment.

FIG. 10 is a schematic sectional view illustrating a semiconductor device according to a third embodiment.

As shown in FIG. 10, the semiconductor device 120 according to the third embodiment is an example applied particularly to IGBT (insulated gate bipolar transistor).

The semiconductor device 120 is different from the semiconductor device 110 in that a p$^+$-type 4H—SiC substrate 17 (fourth semiconductor region) is used instead of the n$^+$-type 4H—SiC substrate 15, and that the first semiconductor region 10 has a stacked structure of a first layer 11 including an n$^+$-type 4H—SiC layer and a second layer 12 including an n$^-$-type 4H—SiC layer. The first semiconductor region 10 is in contact with the substrate 17 and is provided on the substrate 17. The first layer 11 and the second layer 12 constitute a breakdown voltage retention layer.

On the rear surface (lower surface) of the substrate 17, a second electrode D2 is formed. This second electrode D2 constitutes a collector electrode. In the embodiment, the second electrode D2 is made of a stacked film of Ti and Al. The second electrode D2 is ohmically connected by e.g. an annealing process at 800° C. in Ar for 2 minutes.

The first electrode D1 on the contact region 25 constitutes an emitter electrode in the embodiment. The first electrode D1 is ohmically connected to the third semiconductor region 30 and the contact region 25.

The method for manufacturing the semiconductor device 120 is substantially identical to the method for manufacturing the semiconductor device 110 except for forming a first layer 11 and a second layer 12 on the substrate 17.

In the embodiment as described above, a high mobility interface between 4H—SiC and $SiO_2$ is obtained, and a high performance IGBT is realized. The semiconductor device 120 is operated in the bipolar mode. Thus, conductivity modulation occurs, and the on-resistance is small. As a result, the current conduction performance is significantly higher than that of MOSFET.

(Variation)

In the above examples, the embodiments are applied to DiMOSFET or IGBT. However, the embodiments are applicable to any structure having a p-type 4H—SiC region (second semiconductor region 20) in the surface portion of a SiC region (first semiconductor region 10), and having a gate electrode (control electrode G) via a gate insulating film (insulating film 60) on the p-type 4H—SiC region.

For instance, the embodiments are applicable to a transistor such as DiMOSFET and IGBT having a trench gate structure. Besides transistors, the embodiments are applicable to any device such as diode and capacitor having a semiconductor region made of SiC, an insulating film provided on the semiconductor region, and an electrode provided on the insulating film.

The semiconductor devices 110 and 120 according to the present embodiments described above are based on the following points. (1) Sufficient carbon defects are generated near the interface in the process of forming the buried region 50. (2) A buried channel is realized by introducing nitrogen into the generated carbon defects. (3) An interface nitrogen termination structure is formed.

In forming a gate insulating film, passivation film, field oxide film and the like, carbon release from the substrate is suppressed to avoid generation of carbon clusters in the insulating film. For the gate insulating film, this increases the mobility. A buried channel is configured by the formation of the buried region 50, and is not affected by the unevenness of the interface. Furthermore, because the insulating film is formed with suppressed carbon release, carbon is not diffused into the insulating film. This suppresses threshold variation. Furthermore, dipoles and the like at the interface are eliminated. Furthermore, because the interface termination structure is established, the interface orientation dependence is eliminated. Thus, equivalent characteristics are obtained at either the Si surface or C surface of the SiC substrate.

Here, as an example of the method for forming an insulating film less prone to carbon release, use of the difference in oxidation temperature between Si and SiC can be considered. A structure is formed from polysilicon on a portion where an insulating film is to be formed. The polysilicon is oxidized at low temperature. Here, a termination structure according to the embodiment is formed on the SiC substrate surface. Then, because of high oxidation resistance of the SiC substrate surface, only polysilicon is oxidized, and the SiC substrate is not oxidized. That is, no release of carbon in the substrate occurs. Conventionally, the SiC substrate is also oxidized to some extent. Thus, release of carbon also occurs. However, if the termination structure in the embodiment is used, no carbon release occurs. Furthermore, for the field oxide film, the insulation characteristics are significantly improved.

In the method for forming an insulating film by oxidation of polysilicon, doped polysilicon doped with P or As can be used. Then, in the oxidation process, P and As can be diffused into the substrate. This method can be used as a process for forming an ultrathin insulating film in the early phase. Then, a buried region 50 diffused with P or As is formed. Furthermore, by removing P-doped $SiO_2$ or As-doped $SiO_2$ produced by oxidation, the surface of the buried region 50 is terminated. In the case of using P or As instead of diffusing N, such a method of using doped polysilicon can be considered.
(Configuration of Substrate)

In the embodiments described above, transistors such as DiMOSFET and IGBT are taken as examples. However, in the embodiments, a substrate having a termination region in which the outermost surface Si or outermost surface C of SiC is terminated with a group V element may be configured at the surface of the 4H—SiC substrate constituting the device such as a transistor. In this substrate, an n-type semiconductor region or a p-type semiconductor region may be provided in the surface of the 4H—SiC substrate.

As described above, the semiconductor device and the method for manufacturing the same according to the embodiments can achieve high breakdown voltage and stable threshold.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

For instance, in the description of the above embodiments and variations, the first conductivity type is n-type, and the second conductivity type is p-type. However, the invention is also practicable when the first conductivity type is p-type and the second conductivity type is n-type.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a structural body having a first surface, the structural body comprising a first semiconductor region comprising silicon carbide of a first conductivity type, a second semiconductor region comprising silicon carbide of a second conductivity type, and a third semiconductor region comprising silicon carbide of the first conductivity type, the structural body having a portion in which the first semiconductor region, the second semiconductor region, and the third semiconductor region are arranged in an order from the first semiconductor region toward the third semiconductor region in a first direction along the first surface;
an insulating film provided on the first surface of the structural body; and
a control electrode provided on the insulating film,
the structural body having a region comprising a group V element provided between the second semiconductor region and the first surface, wherein
the region comprising a group V element is directly adjacent to the third semiconductor region, the semiconductor device further comprising:
a charge storage region provided in a region adjacent to the region comprising a group V element along the first surface of the structural body,
wherein a concentration of the group V element in the charge storage region is $1 \times 10^{18}$ atoms/$cm^3$ or more and $1 \times 10^{19}$ atoms/$cm^3$ or less.

2. The device according to claim 1, wherein
the region comprising a group V element further comprises an impurity of the second conductivity type, and a concentration of the group V element is substantially equal to concentration of the impurity of the second conductivity type.

3. The device according to claim 2, wherein the concentration of the impurity of the second conductivity type is $1\times10^{18}$ atoms/cm$^3$ or more and $1\times10^{19}$ atoms/cm$^3$ or less.

4. The device according to claim 2, wherein a distribution in a thickness direction of the concentration of the group V element is substantially equal to a distribution in the thickness direction of the concentration of the impurity of the second conductivity type.

5. The device according to claim 1, wherein carbon defect density inside the region comprising a group V element is less than $1\times10^{15}$/cm$^3$.

6. The device according to claim 1, wherein carbon defect density inside the region comprising a group V element is less than $1\times10^{14}$/cm$^3$.

7. The device according to claim 1, wherein a monoatomic layer on outermost side of the first surface of the region comprising a group V element is substantially entirely replaced by the group V element.

8. The device according to claim 1, wherein the region comprising a group V element is provided along a substantially entire surface of the first surface.

9. The device according to claim 1, wherein a thickness of the region comprising a group V element is 5 nanometers or less.

10. The device according to claim 1, wherein an impurity concentration of the second semiconductor region is $1\times10^{18}$ atoms/cm$^3$ or more and $1\times10^{19}$ atoms/cm$^3$ or less.

11. The device according to claim 1, wherein the group V element is at least one selected from the group consisting of N, P, and As.

12. The device according to claim 1, wherein crystal polytype of the silicon carbide is 4H.

13. The device according to claim 1, wherein
the structural body further includes a fourth semiconductor region comprising silicon carbide of the second conductivity type, and
the first semiconductor region is in contact with the fourth semiconductor region and is provided on the fourth semiconductor region.

14. A method for manufacturing a semiconductor device according to claim 1, comprising:
forming a first insulating film on a semiconductor region including silicon carbide;
introducing a group V element into the semiconductor region via the first insulating film;
forming a surface termination structure with the group V element replaced by silicon or carbon by removing the first insulating film;
forming a second insulating film on the surface termination structure; and
forming a control electrode on the second insulating film.

15. The method according to claim 14, wherein the forming a first insulating film comprises forming carbon defects in a region on side of interface with the first insulating film of the semiconductor region.

16. The method according to claim 14, wherein the forming the surface termination structure includes forming a region comprising a group V element by introducing the group V element into the semiconductor region, and then terminating substantially entirely a monoatomic layer on outermost surface side of the region comprising a group V element with the group V element.

17. The method according to claim 14, wherein a thickness of the first insulating film is 5 nanometers or less.

18. The method according to claim 14, wherein the group V element is at least one selected from the group consisting of N, P, and As.

19. A semiconductor device comprising:
a structural body having a first surface, the structural body including a first semiconductor region including silicon carbide of a first conductivity type, a second semiconductor region including silicon carbide of a second conductivity type, and a third semiconductor region including silicon carbide of the first conductivity type, the structural body having a portion in which the first semiconductor region, the second semiconductor region, and the third semiconductor region are arranged in an order from the first semiconductor region toward the third semiconductor region in a first direction along the first surface;
an insulating film provided on the first surface of the structural body; and
a control electrode provided on the insulating film,
the structural body having a buried region provided between the second semiconductor region and the first surface, the buried region being doped with a group V element, wherein
the semiconductor device further comprises a charge storage region provided in a region adjacent to the buried region along the first surface of the structural body,
wherein a concentration of the group V element in the charge storage region is $1\times10^{18}$ atoms/cm$^3$ or more and $1\times10^{19}$ atoms/cm$^3$ or less.

\* \* \* \* \*